United States Patent [19]

Prince et al.

[11] Patent Number: 4,820,651

[45] Date of Patent: Apr. 11, 1989

[54] METHOD OF TREATING BODIES OF III-V COMPOUND SEMICONDUCTOR MATERIAL

[75] Inventors: Francisco C. Prince, Waltham; Craig A. Armiento, Burlington, both of Mass.

[73] Assignee: GTE Laboratories Incorporated, Waltham, Mass.

[21] Appl. No.: 793,869

[22] Filed: Nov. 1, 1985

[51] Int. Cl.$^4$ .......................................... H01L 21/477
[52] U.S. Cl. ........................... 437/22; 148/DIG. 65; 148/DIG. 84; 156/DIG. 73; 357/61; 437/247; 437/945; 437/949
[58] Field of Search ................ 148/171, 1.5, 188, 191, 148/189, 33.3, 185, 177; 428/620; 427/124; 252/951

[56] References Cited

U.S. PATENT DOCUMENTS

| | | | |
|---|---|---|---|
| 2,979,428 | 4/1961 | Jenny et al. | 148/185 |
| 2,995,475 | 8/1961 | Sharpless | 428/620 |
| 4,312,681 | 1/1982 | Rupprecht et al. | 148/1.5 |

Primary Examiner—Brian E. Hearn
Assistant Examiner—Beverly A. Pawlikowski
Attorney, Agent, or Firm—David M. Keay

[57] ABSTRACT

A method of rapid thermal annealing a wafer of an ion implanted III-V compound semiconductor material by heating the wafer in close proximity to a III-V compound semiconductor wafer coated with a layer of tin or indium. A localized overpressure of the Group V element is produced by the combination of the III and V elements with the tin or indium tending to reduce surface decomposition of the implanted wafer.

16 Claims, 1 Drawing Sheet

METHOD OF TREATING BODIES OF III-V COMPOUND SEMICONDUCTOR MATERIAL

BACKGROUND OF THE INVENTION

This invention relates to semiconductor materials. More particularly, it is concerned with methods of introducing conductivity type imparting materials into III-V compound semiconductor materials.

In the fabrication of semiconductor devices and integrated circuits techniques of ion implanting conductivity type imparting materials into wafers of semiconductor material are well known. Subsequent to ion implantation wafers of semiconductor material must be annealed by heating to an appropriate temperature for an appropriate period of time in order to activate the conductivity type imparting materials; that is, in order to permit the atoms of the conductivity type imparting materials to become properly positioned within the crystalline structure of the semiconductor material.

In order to reduce the diffusion of implanted materials during the annealing process, rapid thermal annealing techniques have been developed. Rapid annealing of III-V compound semiconductor materials must be conducted at high temperatures introducing problems because of the loss of the volatile Group V element from the wafer surface. Surface decomposition often results in poor activation of the implanted materials, low carrier mobility, or surface conversion, all of which are detrimental to the performance characteristics of the final device.

One approach to solving this problem involves depositing dielectric encapsulating material, for example silicon nitride, silicon dioxide, or aluminum nitride, on the surface of the semiconductor wafer in order to provide a coating which prevents decomposition at the surface. The dielectric encapsulating material must be of high quality to ensure the integrity of the coating during high temperature treatment. The stress caused by heating due to the mismatch of the thermal expansion coefficients of the semiconductor and encapsulating materials may produce defects in the crystalline structure and enhance the diffusion of conductivity type imparting materials in an uncontrollable manner during the annealing process.

Another approach for preventing surface decomposition is to provide an overpressure of the volatile element, the Group V element, during the annealing treatment. One technique for obtaining an overpressure of the volatile element is by the use of a gaseous source of the element. This procedure, however, requires complicated arrangements in order to ensure that the gas is confined within the annealing chamber.

In another technique a localized overpressure of the volatile element is obtained by placing a wafer of the same III-V compound semiconductor material, or a wafer of another III-V semiconductor material having the same volatile element, in close proximity to the wafer being annealed. Although this procedure is uncomplicated and provides protection for the wafer surface, only a limited temperature range is allowable because of the inability to provide sufficient overpressure of the volatile element at the temperatures which are required to activate the conductivity type imparting materials which are usually employed.

SUMMARY OF THE INVENTION

An improved method which permits a wider range of annealing temperatures and therefore more flexibility in materials employed and in results obtained is provided by the method of introducing conductivity type imparting materials in accordance with the present invention. The method comprises implanting conductivity type imparting material into a region of a body of III-V compound semiconductor material. The body is placed in close proximity to a second body of III-V compound semiconductor material having as a constituent element a Group V element which is also a constituent element of the III-V compound semiconductor material of the first-mentioned body. The second body has a layer of a material on the surface thereof which is facing the first-mentioned body. The matrial of the layer forms a solution with the constituent elements of the second body. The vapor pressure of the Group V element which is constituent element of the III-V compound semiconductor material of the first-mentioned body and of the III-V compound semiconductor material of the second body in equilibrium with this solution being greater than the vapor pressure of the same Group V element in equilibrium with a solution of the constituent elements of the second body alone. The resulting assemblage is heated to anneal the first-mentioned body whereby the second body and layer of material serve as a source of vapor of the Group V element producing a localized overpressure of the Group V element at the surface of the first-mentioned body.

For a better understanding of the present invention, together with other and further objects, advantages, and capabilities thereof, reference is made to the following disclosure and appended claims in connection with the above-described drawings.

DETAILED DESCRIPTION OF THE INVENTION

The present invention is concerned with the implantation by ion bombardment of conductivity type imparting materials into III-V compound semiconductor materials and the subsequent annealing in order to activate the implanted materials. The III-V compound semiconductors include materials such as GaAs, InP, InAs, InGaAs, GaAlAs, and InGaAsP; and also combinations thereof which form III-V heterojunction materials such as GaAlAs/GaAs and InGaAsP/InP. Various conductivity type imparting materials may be implanted in III-V compound semiconductor materials to establish the desired conductivity characteristics of the implanted regions. Typical conductivity type imparting materials include silicon, sulfur, tellurium, selenium, beryllium, zinc, cadmium, and magnesium.

A wafer of a III-V compound semiconductor material is treated as by known ion implantation techniques to implant appropriate conductivity type imparting material into regions of the wafer. A source wafer of the same III-V compound semiconductor material or of a different III-V material which has as a constituent the same volatile Group V element as the implanted wafer serves as a source wafer. One surface of the source wafer is coated with a layer of a suitable material. The source wafer and coating are heated to a temperature sufficient to melt the material of the layer and form a saturated solution of the material and the constituent elements of the source wafer. The material of the layer is selected such that the partial pressure of the Group V element of the source wafer in equilibrium with the solution is greater than the partial pressure of the Group V element in equilibrium with a solution of the constituents of the source wafer alone, without the material of the layer. Tin and indium are two materials which have the proper characteristics for the coating on the source wafer.

Figure 1:
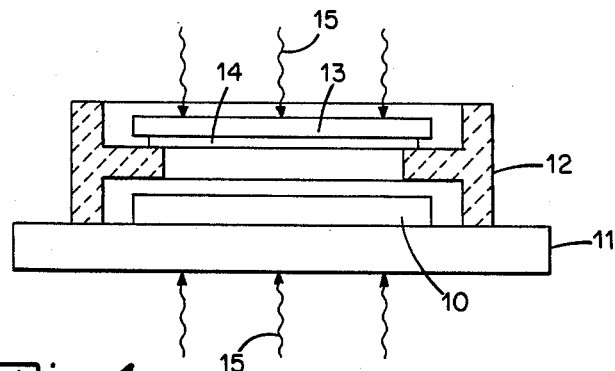
FIG. 1 is a representation in cross-section illustrating the assemblage of parts during annealing in accordance with the method of the present invention.

FIG. 1 depicts the arrangement of the implanted and source wafers for the annealing process. The implanted wafer 10 which is to be annealed is placed implanted surface up on a plate 11 which typically is of silicon and contains a thermocouple for monitoring the temperature. A graphite ring 12 having the cross-sectional configuration as illustrated is placed on the plate 11 over the wafer 10. The source wafer 13 with the metal coating 14 is placed on a shelf of the ring 12 so that the coating 14 is in close proximity to but not in direct contact with the implanted surface of the wafer 10 being treated. Heat is then applied to the assemblage as indicated by the arrows 15 by heat lamps (not shown) placed above and below the assemblage. Depending when the particular III-V compound semiconductor material and conductivity type imparting material, the wafer is heated at a temperature of from about 700° to 1000° C. for a period of from 1 to 30 seconds. Under these conditions the vapors from the coating 14 on the source wafer 13 produce a localized overpressure of the Group V constituent as the wafer 10 being treated, significantly reducing the tendency of the III-V semiconductor material of the wafer 10 to decompose at its exposed surface. As the Group V element is depleted from the layer 14, additional material is supplied from the source wafer 13 to ensure that the solutions remain saturated and that sufficient Group V vapor is available to maintain the localized overpressure conditions.

A wafer of semi-insulating GaAs was implanted with silicon in a conventional manner at 100keV at a dose of $7.0 \times 10^{12}$ cm$^{-2}$. The source wafer was coated with a layer of tin. The coated source wafer was heated at a temperature of 1000° C. for 60 seconds to saturate the tin layer with gallium and arsenic from the source wafer. The implanted wafer and the coated source wafer were placed in an arrangement as illustrated in FIG. 1 with the lower surface of the tin layer spaced approximately 1 millimeter from the upper surface of the implanted wafer. The assemblage was heated at a temperature of 950° C. for 5 seconds.

Wafers annealed as described exhibited sheet resistivities 30% lower than the sheet resistivities of wafers annealed under the same conditions in close proximity to source wafers without layers of tin. The measured mobilities and activation efficiencies of wafers processed according to the invention were 3500 cm$^2$/V-sec and 60% (not corrected for surface depletion effects), respectively, compared to 2800 cm$^2$/V-sec and 45%, respectively, for wafers annealed in the presence of source wafers without tin coatings.

Figure 2:
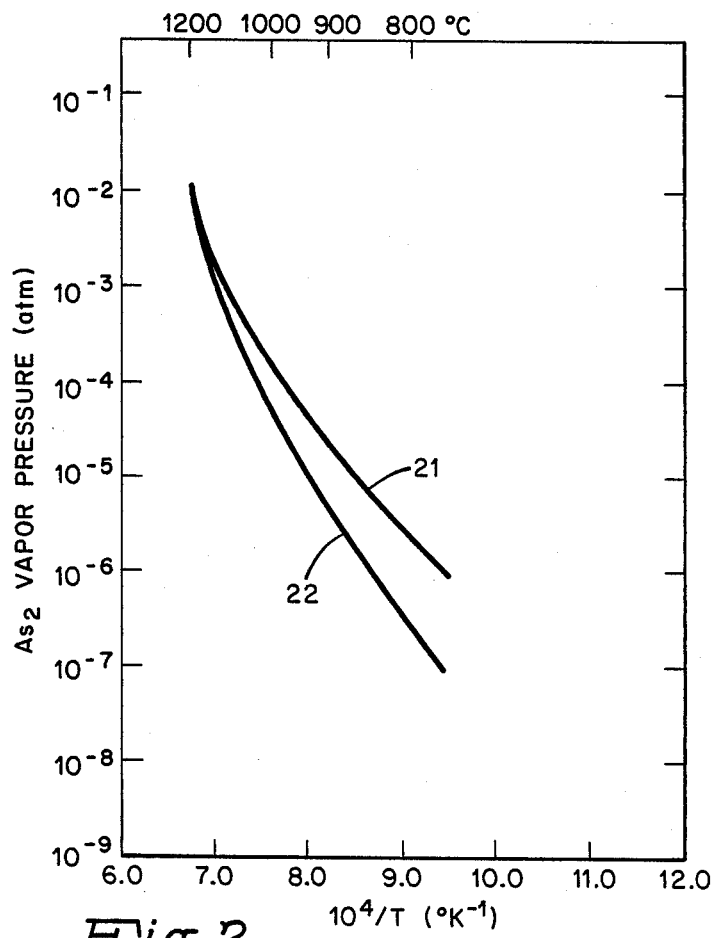
FIG. 2 is a graph showing curves of the vapor pressure of arsenic in equilibrium with gallium arsenide and of arsenic in equilibrium with tin, gallium, and arsenic.

FIG. 2 shows curves 21 and 22 which illustrate the partial pressure of arsenic in equilibrium with tin, gallium, and arsenic and the partial pressure of arsenic in equilibrium with gallium and arsenic, respectively. The differences in partial pressures are due to the solid solubility of the volatile Group V element, arsenic, being higher in tin than in GaAs. As can be seen from the curves of FIG. 2, the As$_2$ vapor pressure-temperature relationships for annealing are enhanced by the presence of tin. The higher arsenic vapor pressures which can be attained at particular temperatures permit a wider latitude of annealing conditions (temperature and time) than heretofore available, thus permitting greater flexibility in the choice of conductivity type imparting materials employed and in the characteristics which may be obtained.

While there has been shown and described what is considered a preferred embodiment of the present invention, it will be obvious to those skilled in the art that various changes and modifications may be made therein without departing from the invention as defined by the appended claims.

What is claimed is:

1. The method of introducing conductivity type imparting material into a body of III-V compound semiconductor material comprising implanting conductivity type imparting material into a region of a body of III-V compound semiconductor material;

placing said body in close proximity to a second body of III-V compound semiconductor material having as a constituent element a Group V element which is also a constituent element of the III-V compound semiconductor material of said first-mentioned body, said second body having a layer of a material on the surface thereof facing said first-mentioned body, the material of said layer forming a solution with the constituent elements of said second body, the vapor pressure of the Group V element which is a constituent element of the III-V compound semiconductor material of the first-mentioned body and of the III-V compound semiconductor material of said second body in equilibrium with said solution being greater than the vapor pressure of the same Group V element in equilibrium with a solution of the constituent elements of said second body alone; and heating the resulting assemblage to anneal the first-mentioned body whereby the second body and layer of material serve as a source of vapor of the Group V element producing a localized overpressure of the Group V element at the surface of the first-mentioned body.

2. The method in accordance with claim 1 wherein the material of said first-mentioned body of III-V compound semiconductor material is selected from the group consisting of GaAs, InP, InAs, InGaAs, GaAlAs, and InGaAsP.

3. The method in accordance with claim 2 wherein the material of said second body of III-V compound semiconductor material is selected from the group consisting of GaAs, InP, InAs, InGaAs, GaAlAs, and InGaAsP.

4. The method in accordance with claim 3 wherein the material of said layer is selected from the group consisting of tin and indium.

5. The method in accordance with claim 4 wherein said resulting assemblage is heated at a temperature of between 700° and 1000° C. for a period of from 1 to 30 seconds.

6. The method in accordance with claim 1 including preparing said second body and said layer by
coating a surface of said second body with a layer of said material; and
heating said second body and said layer of material to dissolve semiconductor material of the second body in the layer of material.

7. The method in accordance with claim 6 wherein the material of said first-mentioned body of III-V compound semiconductor material is selected from the group consisting of GaAs, InP, InAs, InGaAs, GaAlAs, and InGaAsP.

8. The method in accordance with claim 7 wherein the material of said second body of III-V compound semiconductor material is selected from the group consisting of GaAs, InP, InAs, InGaAs, GaAlAs, and InGaAsP.

9. The method in accordance with claim 9 wherein the material of said layer is selected from the group consisting of tin and indium.

10. The method in accordance with claim 9 wherein said resulting assemblage is heated at a temperature of between 700° and 1000° C. for a period of from 1 to 30 seconds.

11. The method of introducing conductivity type imparting material into a body of GaAs comprising
ion implanting a conductivity type imparting material into a region of a body of GaAs;
placing said body of GaAs in close proximity to a second body of GaAs having a layer of tin or a layer of indium on the surface thereof facing said first-mentioned body, said layer being saturated with dissolved GaAs; and
heating the resulting assemblage at a temperature of between 700° and 1000° C. for a period of from 1 to 30 seconds whereby a localized overpressure of arsenic vapor is produced at the surface of the first-mentioned body as the first-mentioned body is annealed.

12. The method in accordance with claim 11 including preparing said second body and said layer by
coating a surface of said second body with a layer of tin or a layer of indium; and
heating said second body and said layer to dissolve semiconductor material of the second body in the layer.

13. The method in accordance with claim 12 wherein said conductivity type imparting material is silicon, and
said resulting assemblage is heated at a temperature of about 950° C. for a period of about 5 seconds.

14. The method in accordance with claim 5 wherein the material of said layer is tin.

15. The method in accordance with claim 10 wherein the material of said layer is tin.

16. The method in accordance with claim 13 wherein coating a surface of said second body comprises
coating said surface of said second body with a layer of tin.

* * * * *